(12) United States Patent
Ge (10) Patent No.: US 9,966,450 B2
(45) Date of Patent: May 8, 2018

(54) DUAL-GATE TFT ARRAY SUBSTRATE AND MANUFACTURING METHOD THEREOF (71) Applicant: SHENZHEN CHINA STAR OPTOELECTRONICS TECHNOLOGY CO., LTD., Shenzhen, Guangdong (CN)

(72) Inventor: Shimin Ge, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 125 days.

(21) Appl. No.: 15/113,602

(22) PCT Filed: Mar. 31, 2016

(86) PCT No.: PCT/CN2016/078016
§ 371 (c)(1),
(2) Date: Jul. 22, 2016

(87) PCT Pub. No.: WO2017/140015
PCT Pub. Date: Aug. 24, 2017

(65) Prior Publication Data
US 2017/0373165 A1 Dec. 28, 2017

(30) Foreign Application Priority Data
Feb. 18, 2016 (CN) .......................... 2016 1 0089516

(51) Int. Cl.
H01L 29/10 (2006.01)
H01L 29/49 (2006.01)
H01L 29/66 (2006.01)
H01L 29/78 (2006.01)
H01L 29/06 (2006.01)
H01L 29/786 (2006.01)
(Continued)

(52) U.S. Cl.
CPC ........ *H01L 29/4908* (2013.01); *G02F 1/1343* (2013.01); *H01L 29/0653* (2013.01); *H01L 29/41733* (2013.01); *H01L 29/66969* (2013.01); *H01L 29/785* (2013.01); *H01L 29/78618* (2013.01)

(58) Field of Classification Search
CPC ............. H01L 29/4908; H01L 51/5256; H01L 51/0097; H01L 27/1225; H01L 2251/5338
See application file for complete search history.

(56) References Cited

U.S. PATENT DOCUMENTS

9,543,543 B2 * 1/2017 Lee .................... H01L 29/78603
9,594,287 B2 * 3/2017 Yu ........................ H01L 51/0097
(Continued)

*Primary Examiner* — Elias M Ullah
(74) *Attorney, Agent, or Firm* — Muncy, Geissler, Olds & Lowe, P.C.

(57) ABSTRACT

A dual-gate TFT (thin film transistor) array substrate and a manufacturing method thereof are provided. A source electrode and a drain electrode are formed on a common electrode layer; and a common electrode of the common electrode layer, the source electrode and the drain electrode can simultaneously be formed by one mask during manufacturing. Therefore, the dual-gate TFT array substrate and the manufacturing method thereof have beneficial effects to reduce the number of masks, shorten the process, and improve the manufacturing efficiency.

10 Claims, 5 Drawing Sheets (51) Int. Cl.
*G02F 1/1343* (2006.01)
*H01L 29/417* (2006.01)

(56) References Cited

U.S. PATENT DOCUMENTS

| | | | | |
|---|---|---|---|---|
| 2007/0273280 A1* | 11/2007 | Kim | .................... | H01L 51/5237 313/509 |
| 2014/0353625 A1* | 12/2014 | Yi | ....................... | H01L 51/5253 257/40 |
| 2015/0102324 A1* | 4/2015 | Lee | .................... | H01L 27/3244 257/40 |

\* cited by examiner

DUAL-GATE TFT ARRAY SUBSTRATE AND MANUFACTURING METHOD THEREOF

FIELD OF THE INVENTION

The present invention relates to a display field, and more particularly to a dual-gate TFT (thin film transistor) array substrate and a manufacturing method thereof.

BACKGROUND OF THE INVENTION

In traditional liquid crystal display technologies, for improving the stability of an oxide TFT (thin film transistor) in a dual-gate TFT array substrate, an etch stop layer (ESL) structure is widely adopted, and the structure can efficaciously decrease influences for back channels from external environment factors and etching damages of source and drain electrodes.

In an active array display device, a single-gate TFT is commonly adopted. But the dual-gate TFT has the advantages of: higher mobility, greater on-state current, smaller threshold swing, better threshold voltage stability, better uniformity, and has better gate bias stability.

However, in a manufacturing method of a dual-gate TFT array substrate of a traditional FFS (fringe field switching) display mode, forming a common electrode and source/drain electrodes each requires one mask (photomask), respectively. Thus, an increased number of masks is required, so that the process complexity and the manufacturing cost are increased, which is disadvantageous to improving the manufacturing efficiency.

SUMMARY OF THE INVENTION

The object of the present invention is to provide an improved dual-gate TFT (thin film transistor) array substrate and a manufacturing method thereof to solve the problems existing in a traditional dual-gate TFT array substrate: a complex manufacturing process and lower manufacturing efficiency.

To solve the above-mentioned problems, the present invention provides technical solutions as follows:

One embodiment of the present invention provides a manufacturing method of a dual-gate TFT array substrate, which comprises steps of:

depositing a first metal layer on a glass substrate, and forming a bottom gate electrode on the first metal layer;

depositing a first insulation layer on the glass substrate and the bottom gate electrode, and forming a semiconductor layer on the first insulation layer;

depositing a second insulation layer on the semiconductor layer and the first insulation layer, and forming a first through hole and a second through hole on the first insulation layer to expose the semiconductor layer;

depositing a common electrode layer on the second insulation layer, wherein the common electrode layer contacts with the semiconductor layer through the first through hole and the second through hole;

depositing a second metal layer on the common electrode layer, and coating a first photoresist layer on the second metal layer; patterning the first photoresist layer by one mask; processing a wet etching to an area of the second metal layer which is uncovered by the first photoresist layer; and forming a common electrode on the common electrode layer, and forming a source electrode and a drain electrode on the second metal layer;

removing the first photoresist layer and the metal of the second layer except the source electrode and the drain electrode;

depositing a third insulation layer on the second insulation layer, the second metal layer and the common electrode layer; and forming a third through hole on the third insulation layer to expose the source electrode; and forming a pixel electrode layer and a top gate electrode on the third insulation layer, wherein the pixel electrode layer contacts with the source electrode through the third through hole.

In the manufacturing method of the dual-gate TFT array substrate according to the present invention, the step of forming the pixel electrode layer and the top gate electrode on the third insulation layer comprises: depositing the pixel electrode layer on the third insulation layer; depositing the third metal layer on the pixel electrode layer, and coating a second photoresist layer on the third metal layer; and patterning the second photoresist layer by a mask, and processing a wet etching to the third metal layer which is uncovered by the second photoresist layer, so as to form the top gate electrode on the third metal layer, and to form the pixel electrode on the pixel electrode layer; and removing the second photoresist layer and the metal of the third metal layer except the top gate electrode.

In the manufacturing method of the dual-gate TFT array substrate according to the present invention, the semiconductor layer includes indium gallium zinc oxide semiconductor.

In the manufacturing method of the dual-gate TFT array substrate according to the present invention, the pixel electrode layer includes indium tin oxide or indium zinc oxide.

In the manufacturing method of the dual-gate TFT array substrate according to the present invention, the first insulation layer includes silica or silicon nitride.

In the manufacturing method of the dual-gate TFT array substrate according to the present invention, the third insulation layer includes silicon nitride.

The present invention further provides a dual-gate TFT array substrate, which comprises:

a glass substrate;
a bottom gate electrode formed on the glass substrate;
a first insulation layer formed on the bottom gate electrode and the glass substrate;
a semiconductor layer formed on the first insulation layer right above the bottom gate electrode;
a second insulation layer formed on the semiconductor layer and the first insulation layer, wherein the second insulation layer is provided with a first through hole and a second through hole to expose the semiconductor layer;
a common electrode layer formed on the second insulation layer, wherein the common electrode layer contacts with the semiconductor layer through the first through hole and the second through hole; and the common electrode layer is provided with a common electrode;
a source electrode and a drain electrode both formed on the common electrode layer;
a third insulation layer formed on the second insulation layer, the common electrode layer, the source electrode and the drain electrode.
a pixel electrode layer formed on the third insulation layer, wherein the pixel electrode layer is provided with a pixel electrode; and
a top gate electrode formed on the pixel electrode layer.

In the dual-gate TFT array substrate according to the present invention, the semiconductor layer includes indium gallium zinc oxide semiconductor.

In the dual-gate TFT array substrate according to the present invention, the pixel electrode layer includes indium tin oxide or indium zinc oxide.

In the dual-gate TFT array substrate according to the present invention, the first insulation layer includes silica or silicon nitride.

Compared with the traditional dual-gate TFT array substrate and the manufacturing method thereof, in the present invention, by forming the source electrode and the drain electrode on the common electrode layer, the common electrode of the common electrode layer, the source electrode, and the drain electrode can simultaneously be formed with one mask during the manufacturing process. Therefore, the dual-gate TFT array substrate and the manufacturing method thereof according to the present invention have beneficial effects to reduce the number of masks, shorten the process, and improve the manufacturing efficiency.

In order to make the above-mentioned contents of the present disclosure more comprehensible, the present disclosure is further described in detail in the following with reference to the embodiments and the accompanying drawings.

DETAILED DESCRIPTION OF THE PREFERRED EMBODIMENTS

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto.

In the drawings, units with similar structures use the same numerals.

Figure 1:
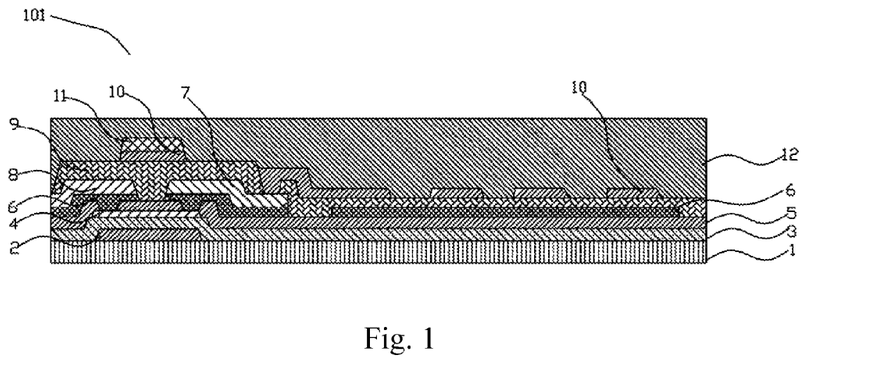
FIG. 1 is a schematic structural view of a dual-gate TFT array substrate according to a preferred embodiment of the present invention.

Refer now to FIG. 1, which is a schematic structural view of a dual-gate TFT array substrate according to a preferred embodiment of the present invention. A dual-gate TFT array substrate 101 according to the preferred embodiment comprises: a glass substrate 1, a bottom gate electrode 2, a first insulation layer 3, a semiconductor layer 4, a second insulation layer 5, a common electrode layer 6, a source electrode 7, a drain electrode 8, a third insulation layer 9, a pixel electrode layer 10, a top gate electrode 11, and a flat layer 12.

The bottom gate electrode 2 is formed on the glass substrate 1; the first insulation layer 3 is formed on the bottom gate electrode 2 and the glass substrate 1; the semiconductor layer 4 is formed on the first insulation layer 3 right above the bottom gate electrode 2; the second insulation layer 5 is formed on the semiconductor layer 4 and the first insulation layer 3; the common electrode layer 6 is formed on the second insulation layer 5, and provided with a common electrode; the source electrode 7 and the drain electrode 8 are both formed on the common electrode layer 6; the third insulation layer 9 is formed on the second insulation layer 5, the common electrode layer 6, the source electrode 7, and the drain electrode 8; the pixel electrode layer 10 is formed on the third insulation layer 9, and provided with a pixel electrode; and the top gate electrode 11 is formed on the pixel electrode layer 10.

In the embodiment, by forming the top gate electrode 11 on the pixel electrode layer 10, the pixel electrode of the pixel electrode layer 10 and the top gate electrode 11 can simultaneously be formed with a single mask; by forming the source electrode 7 and the drain electrode 8 on the common electrode layer 6, the common electrode of the common electrode layer 6, the source electrode 7, and the drain electrode 8 can simultaneously be formed with one mask. Therefore, the dual-gate TFT array substrate of the present invention has beneficial effects to reduce the number of masks, shorten the process, and improve the manufacturing efficiency. Additionally, the top gate electrode 11 can be used as a light shading layer to prevent the electrical stability of the thin film transistor from being influenced by light illumination.

Specifically, the material of the bottom gate electrode 2 is selected from a group consisting of molybdenum (Mo), titanium (Ti), aluminum (Al), copper (Cu), or any stack combination thereof.

The first insulation layer 3 can be deposited and formed by using a method of chemical vapor deposition (CVD), and the material thereof is silicon nitride, silica, or a combination thereof.

The semiconductor layer 4 can be deposited and formed by using a method of physical vapor deposition (PVD), and the material thereof is oxide semiconductor (such as indium gallium zinc oxide semiconductor, IGZO), amorphous silicon semiconductor (a-Si), or a low temperature poly-silicon semiconductor (LTPS).

The material of the second insulation layer 5 is silicon nitride, silica, or a combination thereof. The second insulation layer 5 is patterned by a mask, which includes manufacturing processes of: coating photoresist, exposing, developing, wet etching, and removing photoresist. A first through hole (not labeled in FIG. 1) and a second through hole (not labeled in FIG. 1) are formed on the second insulation layer 5.

The common electrode layer 6 is a transparent electrode, such as an indium tin oxide (ITO) electrode or an indium zinc oxide (IZO) electrode, etc. The source electrode 7 and the drain electrode 8 are symmetrically distributed on the semiconductor layer 4.

The material of the third insulation layer 9 is silicon nitride, silica, or a combination thereof. A third through hole (not labeled in FIG. 1) is disposed on the third insulation layer 9 for exposing the source electrode 7, so that the pixel electrode 10 contacts with the source electrode 7 through the third through hole.

The pixel electrode layer 10 is a transparent electrode, and the material thereof can be, for example, an indium tin oxide (ITO) electrode or an indium zinc oxide (IZO) electrode, etc. The material of the top gate electrode 11 is selected from a group consisting of molybdenum (Mo), titanium (Ti), aluminum (Al), copper (Cu), or any stack combination thereof. The top gate electrode 11 is aligned to the bottom gate electrode 2.

Figure 2:
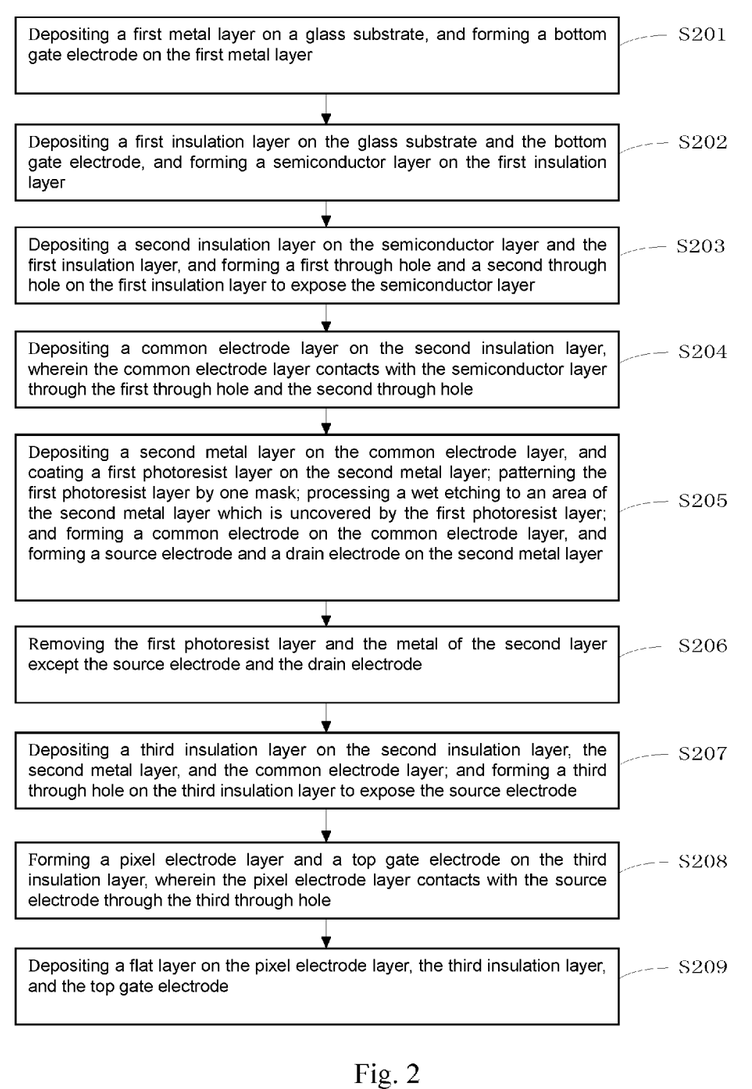
FIG. 2 is a flow chart of a manufacturing method of the dual-gate TFT array substrate according to the preferred embodiment of the present invention.

Refer now to FIG. 2, which is a flow chart of a manufacturing method of the dual-gate TFT array substrate according to the preferred embodiment of the present invention. The manufacturing method comprises following steps of:

S201: depositing a first metal layer on a glass substrate, and forming a bottom gate electrode on the first metal layer;

S202: depositing a first insulation layer on the glass substrate and the bottom gate electrode, and forming a semiconductor layer on the first insulation layer;

S203: depositing a second insulation layer on the semiconductor layer and the first insulation layer, and forming a first through hole and a second through hole on the first insulation layer to expose the semiconductor layer;

S204: depositing a common electrode layer on the second insulation layer, wherein the common electrode layer contacts with the semiconductor layer through the first through hole and the second through hole;

S205: depositing a second metal layer on the common electrode layer, and coating a first photoresist layer on the second metal layer; patterning the first photoresist layer by one mask; processing a wet etching to an area of the second metal layer which is uncovered by the first photoresist layer; and forming a common electrode on the common electrode layer, and forming a source electrode and a drain electrode on the second metal layer;

S206: removing the first photoresist layer and the metal of the second layer except the source electrode and the drain electrode;

S207: depositing a third insulation layer on the second insulation layer, the second metal layer, and the common electrode layer; and forming a third through hole on the third insulation layer to expose the source electrode;

S208: forming a pixel electrode layer and a top gate electrode on the third insulation layer, wherein the pixel electrode layer contacts with the source electrode through the third through hole; and S209: depositing a flat layer on the pixel electrode layer, the third insulation layer, and the top gate electrode.

The above-mentioned steps are described in detail below by referring FIGS. 3A-3L.

Figure 3A:
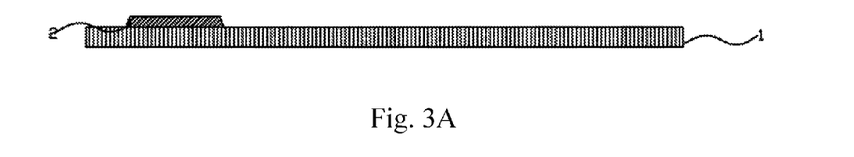
FIGS. 3A-3L are schematic manufacturing views of the manufacturing method of the dual-gate TFT array substrate according to the preferred embodiment of the present invention.

In the step S201, as shown in FIG. 3A, when depositing the first metal layer (not shown) on the glass substrate 1, a method of chemical vapor deposition (CVD) can be adopted to deposit the first metal layer, wherein the material of the first metal layer is selected from a group consisting of molybdenum (Mo), titanium (Ti), aluminum (Al), copper (Cu), or any stack combination thereof; and when forming the bottom gate electrode on the first metal layer, the first metal layer is patterned to form the bottom gate electrode 2 by one mask. The step S202 follows thereafter.

Figure 3B:
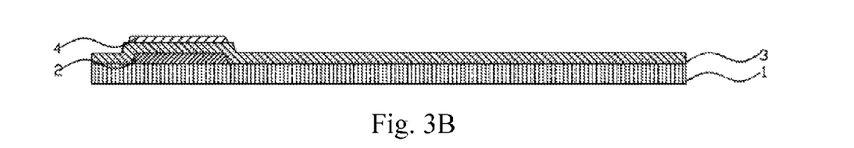

In the step S202, as shown in FIG. 3B, when depositing the first insulation layer 3 on the glass substrate 1 and the bottom gate electrode 2, a method of chemical vapor deposition (CVD) can be adopted to deposit the first insulation layer 3, and the material of the first insulation layer 3 is silicon nitride, silica, or a combination thereof; when forming the semiconductor layer 4 on the first insulation layer 3, a method of physical vapor deposition (PVD) can be adopted to deposit the semiconductor layer 4, and the material of the semiconductor layer 4 is oxide semiconductor (such as indium gallium zinc oxide semiconductor, IGZO), amorphous silicon semiconductor (a-Si), or a low temperature poly-silicon semiconductor (LTPS); and the semiconductor layer 4 is patterned by using a photo etching process, which includes the manufacturing processes of: coating photoresist, exposing, developing, wet etching, and removing photoresist. The step S203 follows thereafter.

Figure 3C:
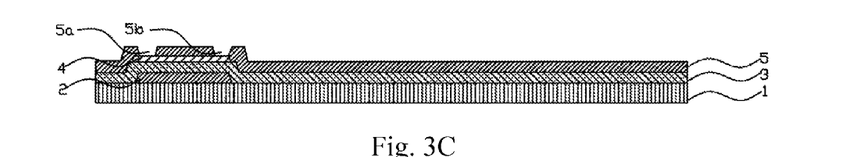

In the step S203, as shown in FIG. 3C, a method of chemical vapor deposition (CVD) is adopted to deposit the second insulation layer 5, and the material of the second insulation layer 5 is silicon nitride, silica, or a combination thereof; and the second insulation layer 5 is patterned by one mask, which includes the manufacturing processes of: coating photoresist, exposing, developing, wet etching, and removing photoresist, wherein the first through hole 5a and the second through hole 5b are formed on the second insulation layer 5. The step S204 follows thereafter.

Figure 3D:
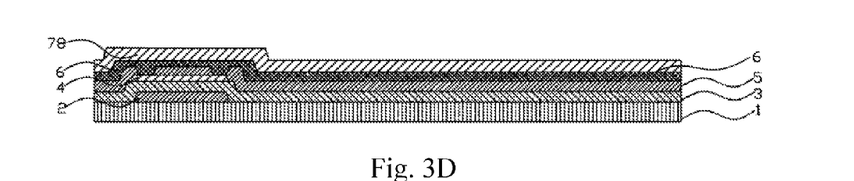

In the step S204, as shown in FIG. 3D, when depositing the common electrode layer 6 on the second insulation layer, the common electrode layer 6 is a transparent electrode, such as an indium tin oxide (ITO) electrode or an indium zinc oxide (IZO) electrode, etc. The step S205 follows thereafter.

Figure 3E:
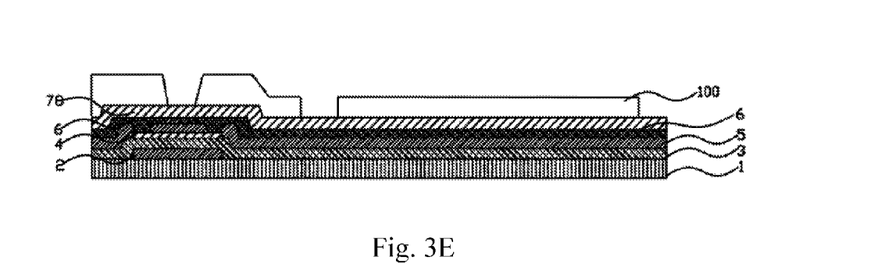
Figure 3F:
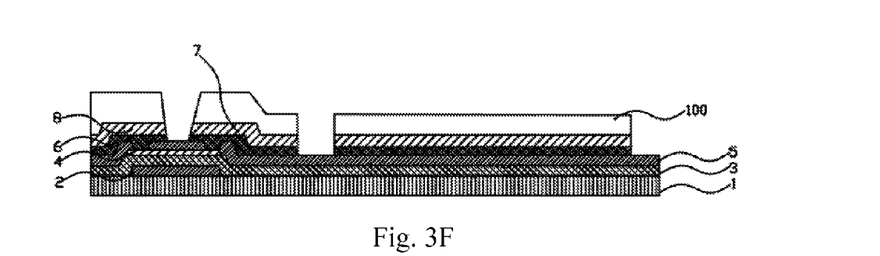

In the step S205, when depositing the second metal layer 78 on the common electrode layer 6, the material of the second metal layer 78 is selected from a group consisting of molybdenum (Mo), titanium (Ti), aluminum (Al), copper (Cu), or any stack combination thereof. As shown in FIG. 3E, after coating a first photoresist layer 100 on the second metal layer 78, the first photoresist layer 100 is patterned by a mask process, which is such as a gray tone mask process (GTM), a half tone mask process (HTM), a single slit mask process (SSM), etc. A partial area of the second metal layer 78 is covered by the first photoresist layer 100, and a predefined area is exposed. As shown in FIG. 3F, by processing a wet etching to the second metal layer 78 which is uncovered by the first photoresist layer 100, a common electrode is formed on the common electrode layer 6, and the source electrode 7 and the drain electrode 8 are formed on the second metal layer 78.

Figure 3G:
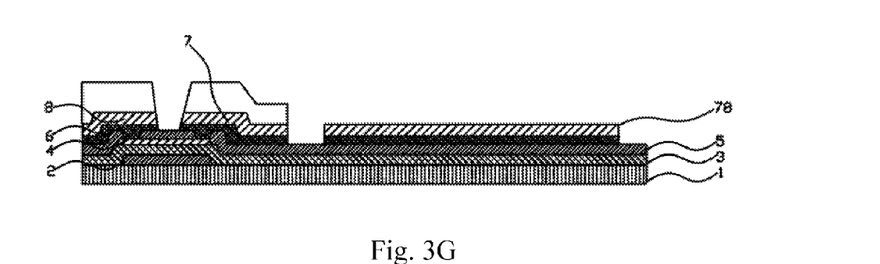
Figure 3H:
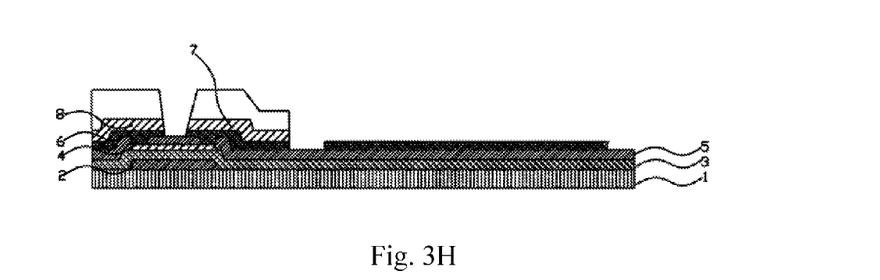
Figure 3I:
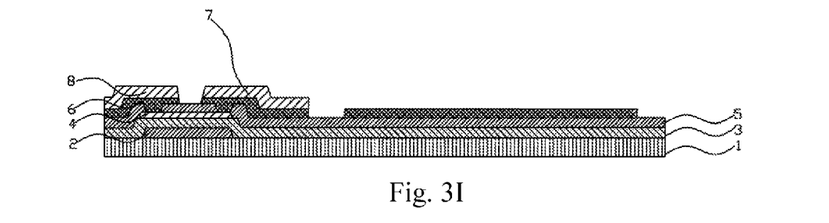

In the step S206, as shown in FIG. 3G, firstly, removing an area of the first photoresist layer 100 which corresponds to the second metal layer 78 except the source electrode 7 and the drain electrode 8; specifically, oxygen is adopted to oxidize and remove the area of the first photoresist layer 100. Next, as shown in FIG. 3H, removing the metal of the second metal layer 78 except the source electrode 7 and the drain electrode 8, for example, a method of wet etching can be adopted. Finally, as shown in FIG. 3I, removing the remained first photoresist layer 100. The step S207 follows thereafter.

Figure 3J:
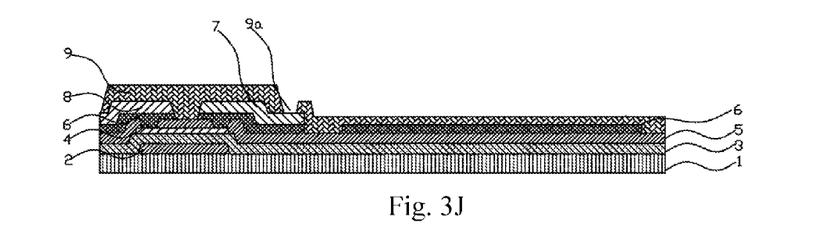

In the step S207, as shown in FIG. 3J, when depositing and forming the third insulation layer 9, the material of the third insulation layer 9 is silicon nitride, silica, or a combination thereof. A third through hole 9a is formed on the third insulation layer 9 by a mask. The step S208 follows thereafter.

Figure 3K:
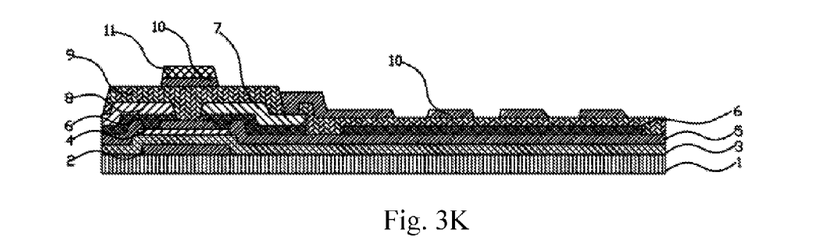

In the step S208, as shown in FIG. 3K, the process of the step is like the step S205, so as to form the pixel electrode layer 10 and the top gate electrode 11. Specifically, the step S208 concretely comprises:

Step A: depositing the pixel electrode layer 10 on the third insulation layer 9, wherein the pixel electrode layer 10 contacts with the source electrode 7 through the third through hole 10a; depositing the third metal layer (not labeled) on the pixel electrode layer 10, and coating a second photoresist layer (not labeled) on the third metal layer; and patterning the second photoresist layer by a mask, and processing a wet etching to the third metal layer which is uncovered by the second photoresist layer, so as to form the top gate electrode 11 on the third metal layer, and to form the pixel electrode on the pixel electrode layer 10.

Step B: removing the second photoresist layer and the metal of the third metal layer except the top gate electrode 11.

In the Step A, the pixel electrode layer 10 is a transparent electrode, such as an indium tin oxide (ITO) electrode or an indium zinc oxide (IZO) electrode, etc. The material of the third metal layer is selected from a group consisting of molybdenum (Mo), titanium (Ti), aluminum (Al), copper (Cu), or any stack combination thereof. After coating the second photoresist layer on the third metal layer, a mask process is used, such as a gray tone mask process (GTM), a half tone mask process (HTM), a single slit mask process (SSM), etc. The second photoresist layer is patterned by a mask, so that a portion of the third metal layer is covered by the second photoresist layer covers, and a predefined area is exposed. Next, an area of the third metal layer which is uncovered by the second photoresist layer is processed by wet etching, so as to form the pixel electrode on the pixel electrode layer 10, and to form the top gate electrode 11 on the third metal layer.

In the Step B, firstly, removing the second photoresist layer which corresponds to the third metal layer except the top gate electrode 11, wherein an oxygen is adopted to oxidize the second photoresist layer, and then to remove the second photoresist layer. Next, removing the area of the third metal layer which is uncovered by the second photoresist layer, such as using the wet etching method. Finally, the remainder of the second photoresist layer is removed.

Figure 3L:
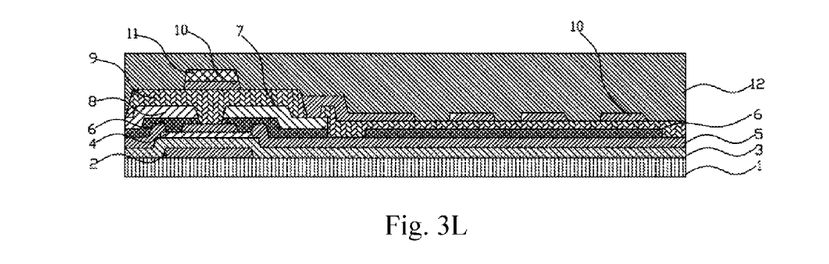

In the step S209, as shown in FIG. 3L, when depositing the flat layer 12 on the pixel electrode layer 10, the third insulation layer 9, and the top gate electrode 11, the flat layer 12 adopts insulation material, such as silicon nitride.

In the embodiment, by forming the top gate electrode 11 on the pixel electrode layer 10, the pixel electrode of the pixel electrode layer 10 and the top gate electrode 11 can simultaneously be formed with one mask; by forming the source electrode 7 and the drain electrode 8 on the common electrode layer 6, the common electrode of the common electrode layer 6, the source electrode 7, and the drain electrode 8 can simultaneously be formed with one mask. Therefore, the dual-gate TFT array substrate of the present invention has beneficial effects to reduce the number of masks, shorten the process, and improve the manufacturing efficiency. Additionally, the top gate electrode 11 can be used as a light shading layer to prevent the electrical stability of the thin film transistor from being influenced by light illumination.

The present invention has been described with preferred embodiments thereof and it is understood that many changes and modifications to the described embodiment can be carried out without departing from the scope and the spirit of the invention that is intended to be limited only by the appended claims.

What is claimed is:

1. A manufacturing method of a dual-gate TFT array substrate, comprising steps of:
   depositing a first metal layer on a glass substrate, and forming a bottom gate electrode on the first metal layer;
   depositing a first insulation layer on the glass substrate and the bottom gate electrode, and forming a semiconductor layer on the first insulation layer;
   depositing a second insulation layer on the semiconductor layer and the first insulation layer, and forming a first through hole and a second through hole on the first insulation layer to expose the semiconductor layer;
   depositing a common electrode layer on the second insulation layer, wherein the common electrode layer contacts with the semiconductor layer through the first through hole and the second through hole;
   depositing a second metal layer on the common electrode layer, and coating a first photoresist layer on the second metal layer; patterning the first photoresist layer by one mask; processing a wet etching to an area of the second metal layer which is uncovered by the first photoresist layer; and forming a common electrode on the common electrode layer, and forming a source electrode and a drain electrode on the second metal layer;
   removing the first photoresist layer and the metal of the second layer except the source electrode and the drain electrode;
   depositing a third insulation layer on the second insulation layer, the second metal layer and the common electrode layer; and forming a third through hole on the third insulation layer to expose the source electrode; and
   forming a pixel electrode layer and a top gate electrode on the third insulation layer, wherein the pixel electrode layer contacts with the source electrode through the third through hole.

2. The manufacturing method of the dual-gate TFT array substrate according to claim 1, wherein the step of forming the pixel electrode layer and the top gate electrode on the third insulation layer comprises:
   depositing the pixel electrode layer on the third insulation layer; depositing the third metal layer on the pixel electrode layer, and coating a second photoresist layer on the third metal layer; and patterning the second photoresist layer by a mask, and processing a wet etching to the third metal layer which is uncovered by the second photoresist layer, so as to form the top gate electrode on the third metal layer, and to form the pixel electrode on the pixel electrode layer; and
   removing the second photoresist layer and the metal of the third metal layer except the top gate electrode.

3. The manufacturing method of the dual-gate TFT array substrate according to claim 1, wherein the semiconductor layer includes indium gallium zinc oxide semiconductor.

4. The manufacturing method of the dual-gate TFT array substrate according to claim 1, wherein the pixel electrode layer includes indium tin oxide or indium zinc oxide.

5. The manufacturing method of the dual-gate TFT array substrate according to claim 1, wherein the first insulation layer includes silica or silicon nitride.

6. The manufacturing method of the dual-gate TFT array substrate according to claim 1, wherein the third insulation layer includes silicon nitride.

7. A dual-gate TFT array substrate, comprising:
   a glass substrate;
   a bottom gate electrode formed on the glass substrate;
   a first insulation layer formed on the bottom gate electrode and the glass substrate;
   a semiconductor layer formed on the first insulation layer right above the bottom gate electrode;
   a second insulation layer formed on the semiconductor layer and the first insulation layer, wherein the second insulation layer is provided with a first through hole and a second through hole to expose the semiconductor layer;
   a common electrode layer formed on the second insulation layer, wherein the common electrode layer contacts with the semiconductor layer through the first through hole and the second through hole; and the common electrode layer is provided with a common electrode;
   a source electrode and a drain electrode both formed on the common electrode layer;

a third insulation layer formed on the second insulation layer, the common electrode layer, the source electrode and the drain electrode;

a pixel electrode layer formed on the third insulation layer, wherein the pixel electrode layer is provided with a pixel electrode; and a top gate electrode formed on the pixel electrode layer.

8. The dual-gate TFT array substrate according to claim 7, wherein the semiconductor layer includes indium gallium zinc oxide semiconductor.

9. The dual-gate TFT array substrate according to claim 7, wherein the pixel electrode layer includes indium tin oxide or indium zinc oxide.

10. The dual-gate TFT array substrate according to claim 7, wherein the first insulation layer includes silica or silicon nitride.

* * * * *